United States Patent [19]

Murotani

[11] Patent Number: 5,329,490
[45] Date of Patent: Jul. 12, 1994

[54] DYNAMIC SEMICONDUCTOR MEMORY WITH REFRESH FUNCTION

[75] Inventor: Tatsunori Murotani, Tokyo, Japan

[73] Assignee: NEC Corporation, Tokyo, Japan

[21] Appl. No.: 35,275

[22] Filed: Mar. 22, 1993

[30] Foreign Application Priority Data

Mar. 23, 1992 [JP] Japan .................................. 4-064432

[51] Int. Cl.⁵ ............................................... G11C 7/00
[52] U.S. Cl. .................................. 365/222; 365/225.7; 365/191; 365/193
[58] Field of Search ............ 365/222, 191, 193, 225.7

[56] References Cited

U.S. PATENT DOCUMENTS

| | | | |
|---|---|---|---|
| 4,829,484 | 5/1989 | Arimoto | 365/222 |
| 4,934,826 | 6/1990 | Miyatake | 365/222 |
| 4,951,258 | 8/1990 | Uehara | 365/222 |

Primary Examiner—Eugene R. LaRoche
Assistant Examiner—Son Mai
Attorney, Agent, or Firm—Mason, Fenwick & Lawrence

[57] ABSTRACT

The memory cell array in accordance with the invention is divided into several memory cell array portions, each memory cell array portion having refresh period determined so as to be adapted to a memory cell having minimum data retention time among memory cells therein. The invention can greatly reduce consumption of electrical power by refresh relative to the conventional memory cell array.

10 Claims, 6 Drawing Sheets

ACTIVATION CONTROL
SIGNAL PRODUCING CIRCUIT

ACTIVATION CONTROL
SIGNAL PRODUCING CIRCUIT

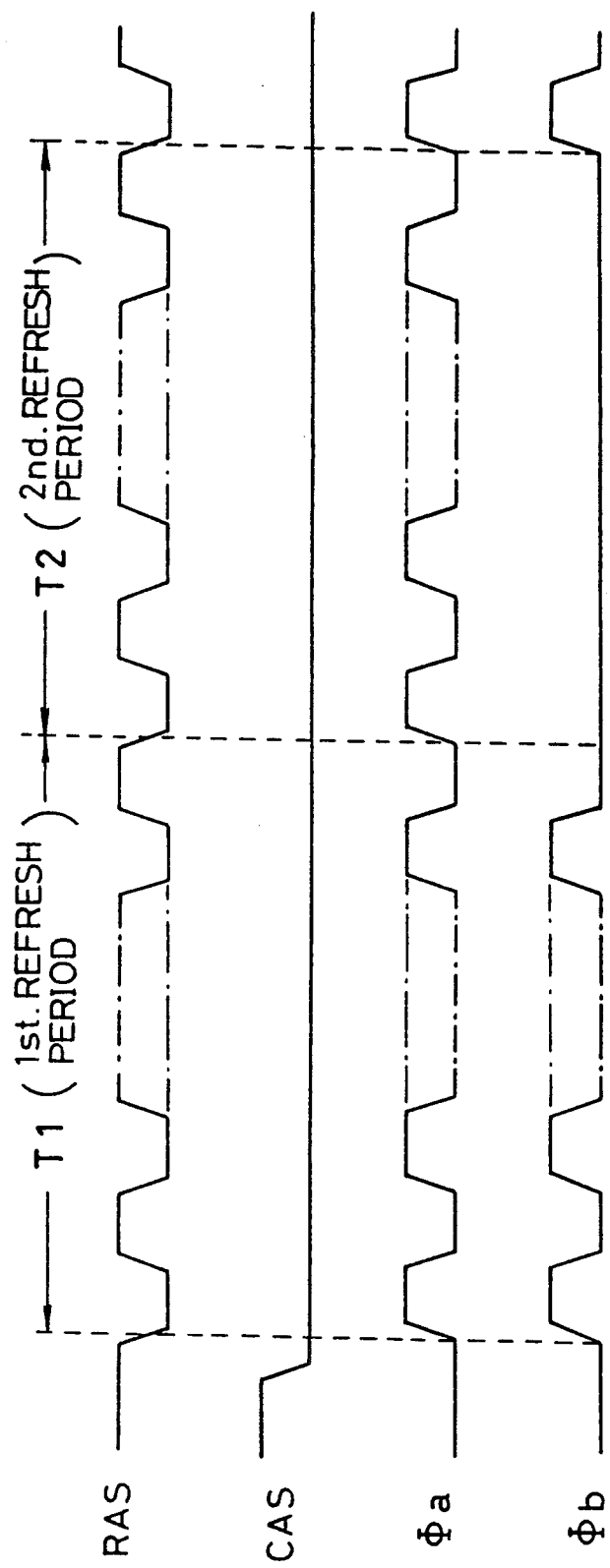

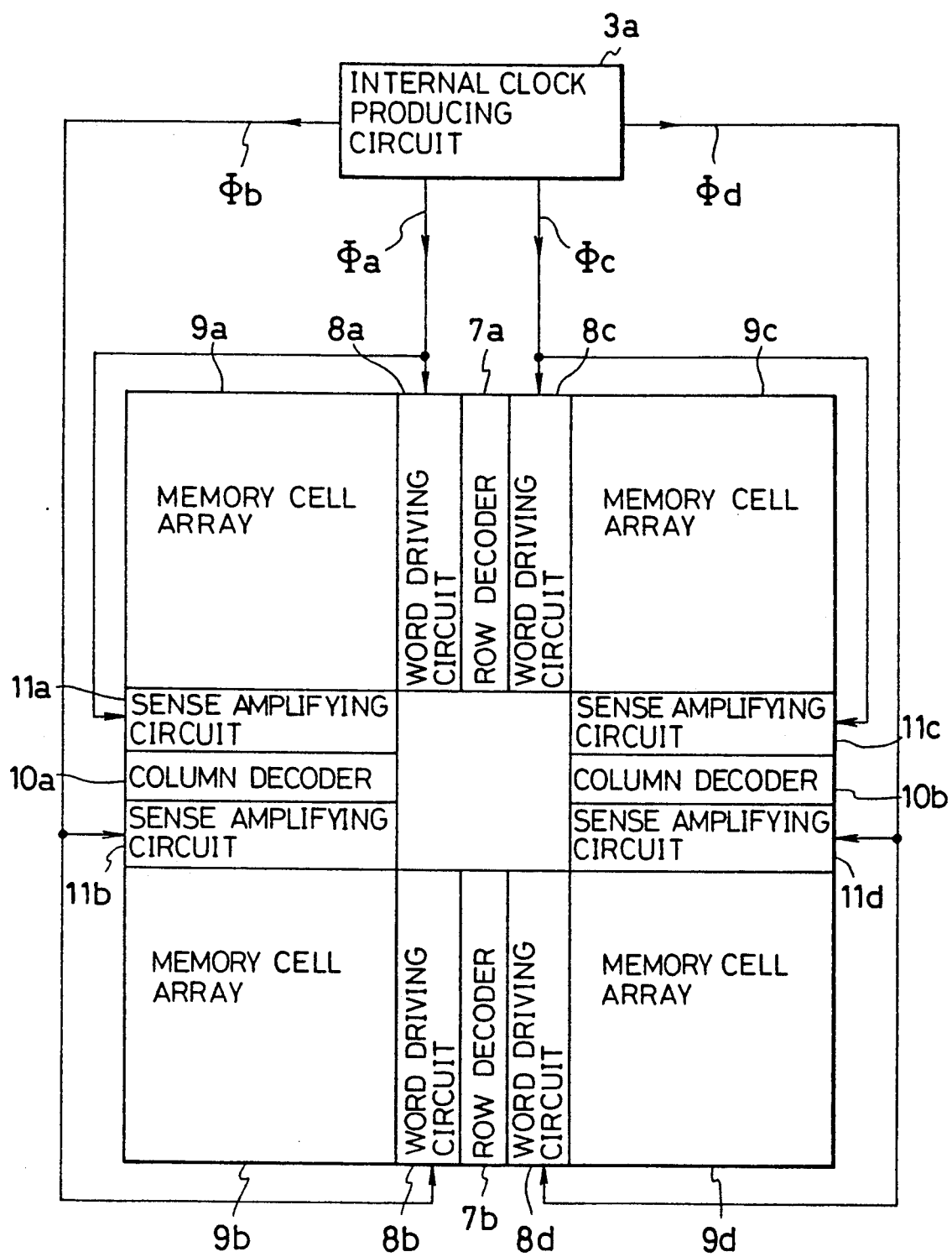

DYNAMIC SEMICONDUCTOR MEMORY WITH REFRESH FUNCTION

BACKGROUND OF THE INVENTION

1. Field of the Invention

This invention relates to a dynamic semiconductor memory and in particular to a dynamic semiconductor memory having a refresh control circuit therein.

2. Related Art Statement

Capacity of a semiconductor memory has been increased at the rate of quadruple every three years. 64 megabit dynamic RAM (DRAM) has already been reported in an academic society of this field. With the increase of their capacity, semiconductor memories have been widely used in many devices such as portable personal computer and word processor. Conventionally, a static RAM (SRAM) has first been used for such applications because of small consumption of electrical power. However, these days DRAM is used instead of SRAM for the purpose of reducing costs because DRAM is cheaper than SRAM for equal amount of capacity. However, DRAM consumes larger electrical power than SRAM because DRAM needs periodic refresh in order to maintain data to be stored in a memory cell. For compensating for this defect, a refresh period is made longer in stand-by condition to decrease consumption of electrical power. For instance, though standard refresh period is 16 milliseconds in 4 megabit DRAM, some of them adopt refresh period of 128 milliseconds, eight times as longer as the standard period, to decrease consumption of electrical power with the result that its consumption of electrical power is decreased to be less than one fifth of standard version. Thus, if the refresh period is made longer, consumption of electrical power can be decreased. However, this brings a problem of excessive requirement for data retention characteristics and so on.

DRAM is developed every generation to have storing capacity four times as large as the previous generation and the number of refresh cycle twice as great as the previous generation. Accordingly, the refresh cycle is doubled to maintain the refresh time to be in a constant rate for all operation time. Therefore, a memory cell is inevitably required to have data retention characteristics twice as long as the previous generation, and additionally required to have the characteristics more than twice as long as the previous generation for reducing consumption of electrical power. On the other hand, a memory cell is small-sized for high density packaging, and thus storing capacity of such a memory cell is decreased relative to the previous generation. In addition, capacitive dielectric film becomes thinner to compensate for reduced storing capacity. These situations make it difficult to reduce leak of current happened inside a memory cell. Thus, though it is easy to just prolong the refresh period, a memory cell is required to have enhanced data retention characteristics, and it is not easy to fabricate the memory cell having such characteristics.

Most of electrical power consumed by DRAM includes charging and discharging current of several parasitic capacitance, transit through current flowing between transistors and little of steady-state current. Thus, longer operation cycle time reduces consumption of current in inverse proportion. Accordingly, if the refresh period is made longer, it is possible to prolong operation cycle time because the number of refresh cycle during that time is constant, thereby consumption of power being able to be reduced.

For instance, in the case of 4 megabit DRAM, data retention characteristics are not uniform, but widely vary. Data retention characteristics measured at room temperature is represented in FIG. 1 wherein the axis of abscissa represents data retention time and the axis of ordinate represents the number of cumulation of inferior bits, both axes being expressed in logarithm. The most inferior bit has only about 1 second of retention time, while the number of cumulation of inferior bits at 100 seconds of retention time is just hundreds of bits, which is just not more than one hundred thousandth relative to 4 megabit.

Data retention time for 4 megabit DRAM is standardized to be 16 milliseconds. Since this value is a minimum at 70 degrees centigrade at which retention characteristics are deteriorated because of high temperature, this standard cannot be met with unless the retention characteristics are at least 0.5 seconds at a room temperature. That is, though 99.9% or more of bits have characteristics not less than hundred times as sufficient as the standard, refresh of all bits has to be done in shorter periods because of a few inferior bits.

FIG. 2 shows a structure of such a conventional dynamic semiconductor memory.

The dynamic semiconductor memory has a buffer circuit 1 for receiving RAS (row address strobes) and CAS (column address strobes) and buffer amplifying them; a CBR identifying circuit 2 for producing refresh mode signals RM at active level when it detects that a mode is CBR (CAS Before RAS) refresh mode on the basis of output signals transferred from the buffer circuit 1; a refresh address signal generating circuit 4 for producing refresh address signals RAD when the refresh mode signal RM is at active level; an internal control signal producing circuit 3b for receiving the output signals emitted from the buffer circuit 1, the refresh mode signal RM and timing signal TS emitted from the refresh address signal generating circuit 4 to generate activation control signal $\phi$ which is introduced to be at activated level at a predetermined timing; an address buffer circuit 5 for receiving an external address signal AD to output external address signals ADr and ADc; a switch circuit 6 for selecting the refresh address signal RAD if the refresh mode signal RM is of active level while selecting the external address signal ADr if the refresh mode signal RM is of inactive level; memory cell arrays 9a and 9b each having a plurality of memory cells, word lines and bit lines; row selecting circuit having row decoders 7a and 7b and word driving circuits 8a and 8b for being activated when the activation control signal $\phi$ is of activated level, to put a predetermined word line in the associated memory cell array 9a, 9b to be on selection level; sense amplifying circuits 11a and 11b for being activated when the activation control signal $\phi$ is of activated level, to amplify and rewrite data stored in a memory cell through the bit lines, the cell connecting with a word line of selection level of associated memory cell arrays 9a and 9b; a column decoder 10 for selecting a predetermined bit line in the memory cell array 9a, 9b in accordance with the external address signal ADc emitted from the address buffer circuit 5; and an input and output circuit 12 for transferring data DI, which is externally input and to be written therein, to a determined bit line and outputting readout data transferred through the determined bit line.

In the case of 4 megabit DRAM, the external address signal AD is 11 bits and this is divided by time-sharing into row address signals ADr and column address signals ADc. Accordingly, a matrix having 2048 rows and 2048 columns is created. However, refresh is determined to be done every 1024 cycle by 10 bits of the row address signals ADr. Therefore, as illustrated in FIG. 2, a pair of the row decoders 7a and 7b and a pair of word driving circuit 8a and 8b both for driving 1024 word lines are provided. They simultaneously drive word lines in each of the memory cell arrays 9a and 9b.

As aforementioned, in a conventional dynamic semiconductor memory, the pair of memory cell arrays 9a and 9b are adapted to be refreshed at the same period and the same timing. Thus, even if there is no memory cell having inferior data retention characteristics in one of memory cell arrays, they both have to be refreshed at the same period, thereby causing it difficult to reduce consumption of electrical power during refreshing.

SUMMARY OF THE INVENTION

It is an object of the present invention to provide a dynamic semiconductor memory capable of reducing consumption of electrical power during refreshing.

The invention provides a dynamic semiconductor memory comprising a refresh mode identifying circuit for producing a refresh mode signal of active level when the identifying circuit detects that a mode is a refresh mode; a refresh address signal generating circuit for generating a refresh address signal if the refresh mode signal is of active level; a switch circuit for selecting the refresh address signal if the refresh mode signal is of active level while selecting an external address signal if the refresh mode signal is of inactive level; a plurality of memory cell arrays each having a plurality of memory cells, word lines and bit lines; an internal control signal producing circuit for producing a plurality of activation control signals each of which is associated with each of the memory cell arrays and becomes to be of activated level at a predetermined timing; a plurality of row selecting circuits for being activated when the associated activation control signal is of activated level, to put a predetermined word line in the associated memory cell array to be on selection level in accordance with an address signal generated from the switch circuit; and a plurality of sense amplifying circuits for being activated when the associated activation control signal is of activated level, to amplify and rewrite data stored in a memory cell which connects with a word line of selection level of associated memory cell array.

The above-mentioned row selecting circuit comprises a row decoder and a word driving circuits.

In a preferred embodiment, the internal control signal producing circuit is provided with activation level controlling means for externally programming timing at which the activation control signals become to be of activated level.

The above and other objects and advantageous features of the present invention will be made apparent from the following description made with reference to the accompanying drawings.

BRIEF DESCRIPTION OF THE DRAWINGS

FIG. 4 illustrates timings for each signal for operation of the embodiment of FIG. 3a; and FIG. 5 is a block diagram of a second embodiment of a dynamic semiconductor memory in accordance with this invention.

DESCRIPTION OF THE PREFERRED EMBODIMENTS

Preferred embodiments in accordance with this invention will be explained hereinbelow with reference to drawings.

Figure 1:
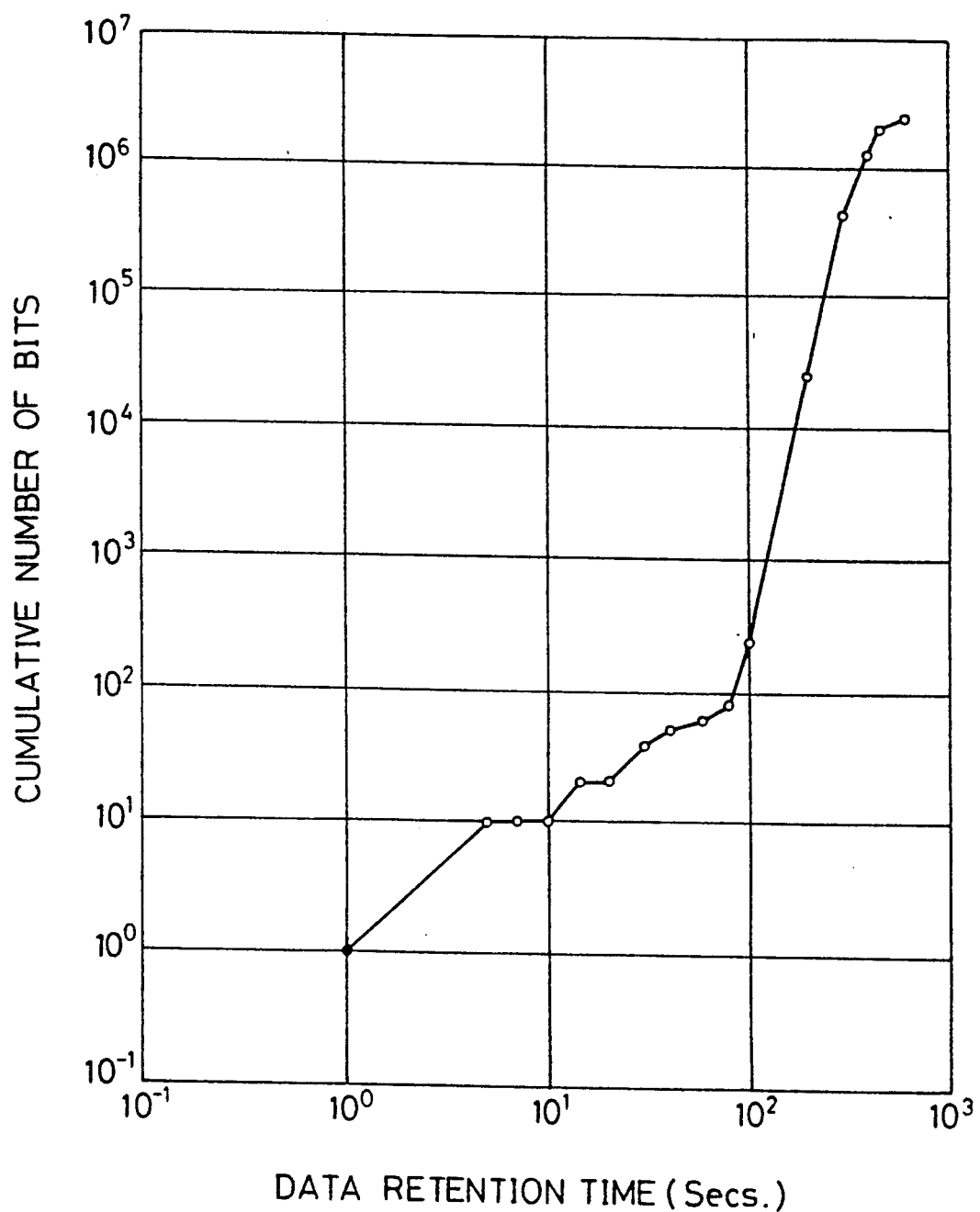
FIG. 1 is a characteristic curve showing a relationship between data retention time and cumulative number of bits of a memory cell array in a conventional dynamic semiconductor memory.
Figure 2:
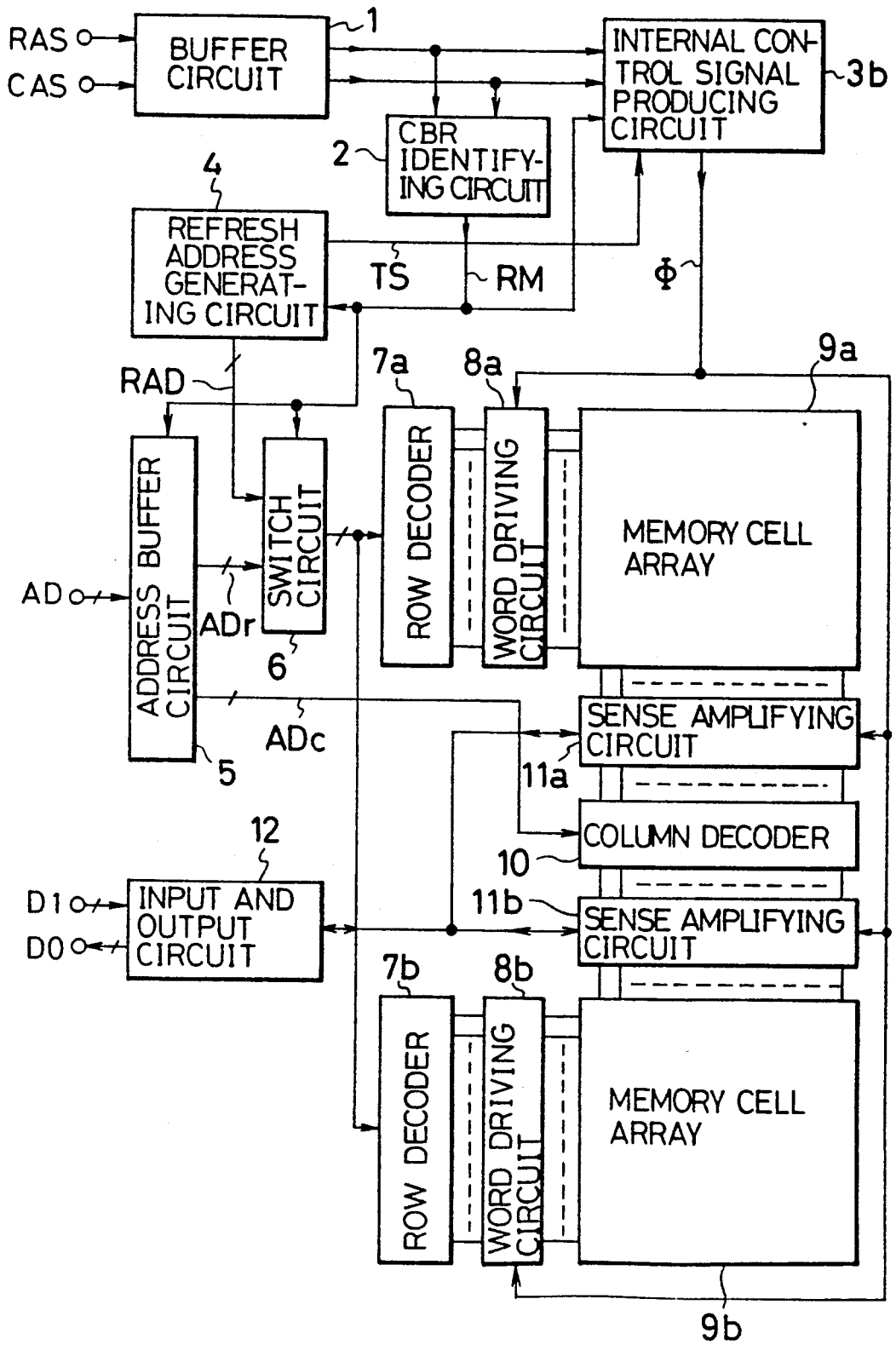
FIG. 2 is a block diagram of a conventional dynamic semiconductor memory.
Figure 3A:
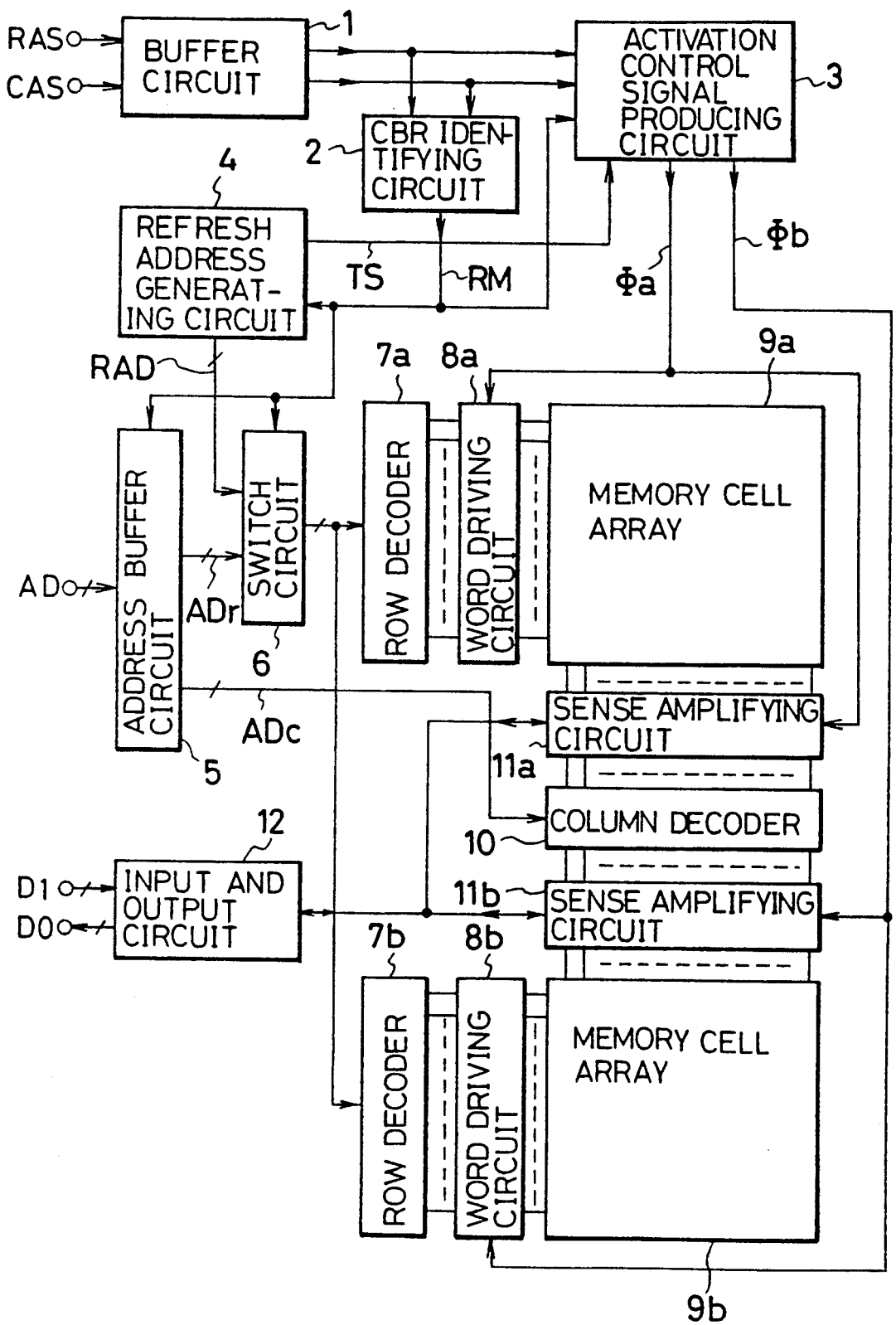
FIG. 3a is a block diagram of a first embodiment of a dynamic semiconductor memory in accordance with this invention.

FIG. 3a is a block diagram illustrating a first embodiment of a dynamic semiconductor memory in accordance with this invention. All the parts and/or elements which are identical to those depicted in FIG. 2 bear the same reference numerals and details thereof are thus omitted for simplicity.

This embodiment is different from a conventional dynamic semiconductor memory shown in FIG. 2 in that the activation control signal producing circuit 3 generates first and second activation control signals $\phi a$ and $\phi b$, and activation of a first row selecting circuit comprising the first row decoder 7a and word driving circuit 8a is controlled by the first activation control signal $\phi a$ while activation of a second row selecting circuit comprising the second row decoder 7b and word driving circuit 8b is controlled by the second activation control signal $\phi b$. The number of the row decoder may be of one if it is connected to the word driving circuits so as to be operated in the same manner as mentioned above.

Thus, if the memory cell array 9a has a memory cell having relatively short data retention time and the memory cell array 9b does not have such a memory cell, as illustrated in FIG. 4, the first activation control signal $\phi a$ may be biased to be of activated level every refresh period and the second activation control signal $\phi b$ may be biased to be of activated level every other refresh period. This arrangement brings a profit of reducing consumption of electrical power by refresh to be three fourth ($\frac{3}{4}$) relative to a conventional memory. If one of memory cell arrays has data retention time not less than four times as much as the other, the refresh of the one of memory cell arrays is sufficient with one refresh period every four refresh period, thereby reducing consumption of electrical power to be five eighth ($\frac{5}{8}$).

Figure 3B:
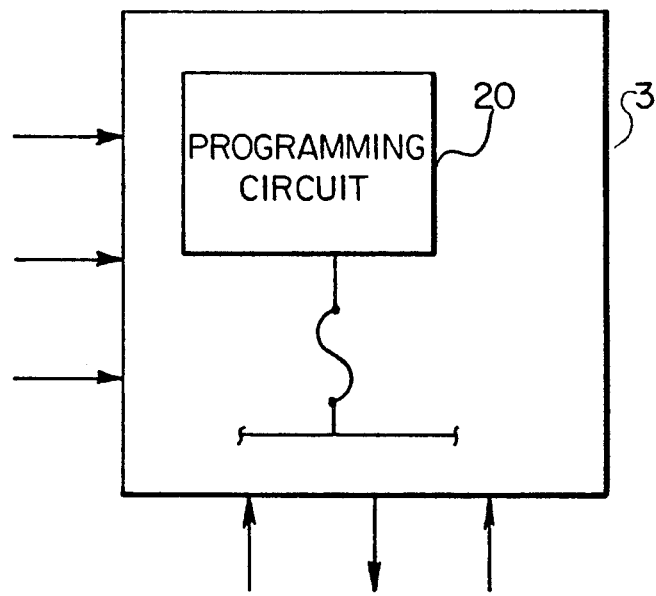
FIG. 3b shows the activation control signal producing circuit of the first embodiment in one aspect of its programming circuit.
Figure 3C:
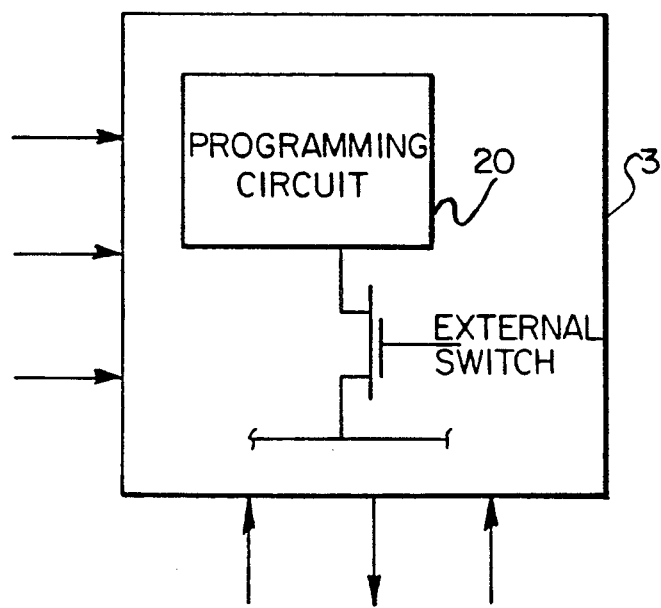
FIG. 3c shows the activation control signal producing circuit of the first embodiment is a second aspect of its programming circuit.

As aforementioned, memory cells having inferior data retention characteristics are just a few, but appear randomly. In addition, it is impossible to know which memory cell array 9a or 9b has such inferior memory cells. In order to determine which memory cell is an inferior one, the activation control signal producing circuit 3 may be provided with a programing circuit 20 for making such a determination at an initial stage, however, the simplest process for making such a determination is a redundancy process which is often used for DRAM. In this redundancy process, an inferior memory cell is detected to program its replacement-related information by melting a fuse by means of, for instance, laser beam. Therefore, a programming circuit 20 may be provided using a fuse and programmed simultaneously with redundant programming as shown in FIG. 3b. Alternatively, a transistor may be used instead of a fuse and thus the programming circuit 20 may be programmed by externally switching the transistor to be on or off as shown in FIG. 3c.

FIG. 5 is a block diagram illustrating a gist of a second embodiment of a dynamic semiconductor memory in accordance with this invention. All the parts and/or elements which are identical to those depicted in FIGS. 2 and 3 bear the same reference numerals and details thereof are thus omitted for simplicity.

In the dynamic semiconductor memory of this embodiment, both rows and columns are divided into two groups and the memory comprises four memory cell arrays 9a, 9b, 9c and 9d.

Furthermore, in this embodiment, an internal clock producing circuit 3a produces first to fourth activation control signals $\phi a$ to $\phi d$, and activation of the first row selecting circuit comprising the row decoder 7a and word driving circuit 8a is controlled by the first too activation control signal $\phi a$ while activation of the second row selecting circuit comprising the row decoder 7b and word driving circuit 8b is controlled by the second activation control signal $\phi b$, and activation of the third row selecting circuit comprising the row decoder 7a and a word driving circuit 8c is controlled by the third activation control signal $\phi c$ while activation of the fourth row selecting circuit comprising the row decoder 7b and a word driving circuit 8d is controlled by the fourth activation control signal $\phi d$. Sense amplifying circuits 11a and 11b are activated when activation control signals $\phi a$ and $\phi b$ are of activated level, to amplify and rewrite data stored in a memory cell, which connects with a word line of selection level of associated memory cell arrays 9a and 9b, through the bit lines while sense amplifying circuits 11c and 11d are activated when activation control signals $\phi c$ and $\phi d$ are of activated level, to amplify and rewrite data stored in a memory cell which connects with a word line of selection level of associated memory cell arrays 9c and 9d, through the bit lines. A column decoder 10a selects a predetermined bit line in the memory cell arrays 9a and 9b while a column decoder 10b selects a predetermined bit line in the memory cell arrays 9c and 9d. Of course, the number of the row decoders may be of four so as to be adapted to the number of the word driving circuits.

A buffer circuit, CBR identifying circuit, refresh address generating circuit, switch circuit, address buffer circuit and input/output circuit are not shown in FIG. 5 for simplicity, but are connected and operated in the similar manner to those of FIGS. 2 and 3.

Greater number of division of the memory cell array into groups makes it possible to control more suitably inferior memory cells randomly generated to thereby reduce consumption of electrical power. For instance, if only the memory cell array 9a has a memory cell having inferior data retention characteristics and the other memory cell arrays 9b, 9c and 9d have data retention time at least twice as much as the standard time, consumption of electrical power is reduced to be five eighth ($\frac{5}{8}$) relative to a conventional one. If they have data retention time at least fourth as much as the standard time, consumption of electrical power is reduced to be seven sixteenth (7/16), which is less than half than a conventional one. In accordance with this invention, such a greater number of division makes it possible to easily reduce consumption of electrical power.

As aforementioned with reference to the preferred embodiments, the present invention has many advantages. In the invention, a memory cell array is divided into several memory cell array portions, each memory cell array portion having refresh period determined so as to be adapted to a memory cell having minimum data retention time among memory cells therein. This brings an advantage over the conventional memory cell array in which all memory cell array portion are refreshed with common refresh period, that consumption of electrical power by refresh can be enormously reduced relative to the conventional memory cell array.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A dynamic semiconductor memory comprising:
   a refresh mode identifying circuit for producing a refresh mode signal of active level when said identifying circuit detects that a mode is a refresh mode;
   a refresh address signal generating circuit for generating a refresh address signal if said refresh mode signal is of active level;
   a switch circuit for selecting said refresh address signal if said refresh mode signal is of active level while selecting an external address signal if said refresh mode signal is of inactive level;
   a plurality of memory cell arrays each having a plurality of memory cells, word lines and bit lines;
   an internal control signal producing circuit for producing a plurality of activation control signals each of which is associated with each of said memory cell arrays and becomes to be of activated level at a predetermined timing;
   a plurality of row selecting circuits for being activated when said associated activation control signal is of activated level, to put a predetermined word line in said associated memory cell array to be on selection level in accordance with an address signal generated from said switch circuit; and
   a plurality of sense amplifying circuits for being activated when said associated activation control signal is of activated level, to amplify and rewrite data stored in a memory cell which connects with a word line of selection level of associated memory cell array.

2. The dynamic semiconductor memory in accordance with claim 1, wherein said internal control signal producing circuit is provided with activation level controlling means for externally programming timing at which said activation control signals become to be of activated level.

3. The dynamic semiconductor memory in accordance with claim 2, wherein said activation level controlling means is a programing circuit using a fuse or transistor.

4. The dynamic semiconductor memory in accordance with claim 1, wherein said memory cell arrays are of two, said activation control signals are of two, said row selecting circuits are of two each having a row decoder and a word driving circuit, and said sense amplifying circuits are of two.

5. The dynamic semiconductor memory in accordance with claim 1, wherein said memory cell arrays and said activation control signals are of four, respectively, said row selecting circuits have two row decoders and four word driving circuits, each of said two row decoders being connected to the two word driving circuits, and said sense amplifying circuits are of four.

6. A dynamic semiconductor memory comprising:
a buffer circuit for receiving row address control signals and column address control signals and buffer amplifying said row and column address control signals;
a refresh mode identifying circuit for producing a refresh mode signal of active level when said identifying circuit detects that a mode is a refresh mode on the basis of output signals transferred from said buffer circuit;
a refresh address signal generating circuit for generating a refresh address signal if said refresh mode signal is of active level;
an address buffer circuit for receiving an external address signal to output external row and column address signals;
a switch circuit for selecting said refresh address signal if said refresh mode signal is of active level while selecting said external row address signal if said refresh mode signal is of inactive level;
two memory cell arrays each having a plurality of memory cells, word lines and bit lines;
an internal control signal producing circuit for receiving said output signals transferred from said buffer circuit, said refresh mode signal and timing signal transferred from said refresh address signal generating circuit to produce two activation control signals each of which is associated with each of said memory cell arrays and becomes to be of activated level at a predetermined timing;
two row selecting circuits for being activated when said associated activation control signal is of activated level, to put a predetermined word line in said associated memory cell array to be on selection level in accordance with an address signal generated from said switch circuit;
two sense amplifying circuits for being activated when said associated activation control signal is of activated level, to amplify and rewrite data stored in a memory cell which connects with a word line of selection level of associated memory cell array;
a column decoder for selecting a predetermined bit line in said associated memory cell array in accordance with said external column address signal; and
an input and output circuit for transferring data, which is externally input and to be written therein, to the selected bit line and outputting readout data transferred through said selected bit line.

7. The dynamic semiconductor memory in accordance with claim 6, wherein said internal control signal producing circuit is provided with activation level controlling means for externally programming timing at which said activation control signals become to be of activated level.

8. The dynamic semiconductor memory in accordance with claim 6, wherein each of said row selecting circuits comprises a row decoder and a word driving circuit.

9. A dynamic semiconductor memory comprising:
a buffer circuit for receiving row address control signals and column address control signals and buffer amplifying said row and column address control signals;
a refresh mode identifying circuit for producing a refresh mode signal of active level when said identifying circuit detects that a mode is a refresh mode on the basis of output signals transferred from said buffer circuit;
a refresh address signal generating circuit for generating a refresh address signal if said refresh mode signal is of active level;
an address buffer circuit for receiving an external address signal to output external row and column address signals;
a switch circuit for selecting said refresh address signal if said refresh mode signal is of active level while selecting said external row address signal if said refresh mode signal is of inactive level;
four memory cell arrays each having a plurality of memory cells, word lines and bit lines;
an internal clock producing circuit for receiving said output signals transferred from said buffer circuit, said refresh mode signal and timing signal transferred from said refresh address signal generating circuit to produce four activation control signals each of which is associated with each of said memory cell arrays and becomes to be of activated level at a predetermined timing;
four row selecting circuits for being activated when said associated activation control signal is of activated level, to put a predetermined word line in said associated memory cell array to be on selection level in accordance with an address signal generated from said switch circuit;
four sense amplifying circuits for being activated when said associated activation control signal is of activated level, to amplify and rewrite data stored in a memory cell which connects with a word line of selection level of associated memory cell array;
two column decoders for selecting a predetermined bit line in said associated memory cell array in accordance with said external column address signal; and
an input and output circuit for transferring data, which is externally input and to be written therein, to the selected bit line and outputting readout data transferred through said selected bit line.

10. The dynamic semiconductor memory in accordance with claim 9, wherein said internal clock producing circuit is provided with activation level controlling means for externally programming timing at which said activation control signals become to be of activated level.

* * * * *